United States Patent
Galano et al.

(10) Patent No.: US 9,385,678 B2
(45) Date of Patent: Jul. 5, 2016

(54) METHODS AND SYSTEMS FOR CONTROLLING VOLUME

(71) Applicants: Daniel Galano, Miramar, FL (US); Joseph Porembski, Columbus, OH (US); Aaron M. Ambrose, Shawnee Hills, OH (US)

(72) Inventors: Daniel Galano, Miramar, FL (US); Joseph Porembski, Columbus, OH (US); Aaron M. Ambrose, Shawnee Hills, OH (US)

(73) Assignee: Honda Motor Co., Ltd., Tokyo (JP)

( * ) Notice: Subject to any disclaimer, the term of this patent is extended or adjusted under 35 U.S.C. 154(b) by 97 days.

(21) Appl. No.: 14/199,542

(22) Filed: Mar. 6, 2014

(65) Prior Publication Data
US 2014/0328499 A1    Nov. 6, 2014

Related U.S. Application Data

(60) Provisional application No. 61/819,468, filed on May 3, 2013.

(51) Int. Cl.
*H03G 3/00* (2006.01)
*H03G 3/30* (2006.01)

(52) U.S. Cl.
CPC ........... *H03G 3/3089* (2013.01); *H03G 3/3005* (2013.01)

(58) Field of Classification Search
CPC ........................... H03G 3/3089; H03G 3/3005
USPC ................. 381/104–107, 109, 119, 28, 55, 80
See application file for complete search history.

(56) References Cited

U.S. PATENT DOCUMENTS

| | | | |
|---|---|---|---|
| 5,046,107 A | 9/1991 | Iwamatsu | |
| 5,054,077 A | 10/1991 | Suzuki | |
| 5,910,996 A * | 6/1999 | Eggers | H04R 5/04 381/107 |
| 8,019,094 B2 | 9/2011 | Hsieh et al. | |
| 8,045,732 B1 | 10/2011 | Goodwin et al. | |
| 8,249,277 B2 * | 8/2012 | Wong | H03G 3/001 381/102 |
| 8,290,182 B2 * | 10/2012 | Chung | H03G 3/20 381/106 |
| 2004/0213421 A1 * | 10/2004 | Jacobs | H04S 7/00 381/104 |
| 2005/0054305 A1 | 3/2005 | Hagiwara et al. | |
| 2007/0177743 A1 | 8/2007 | Mertens | |
| 2008/0159546 A1 * | 7/2008 | Dahl | H04S 7/00 381/28 |

(Continued)

FOREIGN PATENT DOCUMENTS

| | | | | |
|---|---|---|---|---|
| JP | 2006339709 | | 12/2006 | |
| WO | 2009122239 A1 | | 10/2009 | |
| WO | WO 2009122239 A1 * | | 10/2009 | ............. H04N 5/602 |

OTHER PUBLICATIONS

Pot Search Report for related matter PCT/US2014/035855 dated Sep. 12, 2014, 12 pp.

*Primary Examiner* — Vivian Chin
*Assistant Examiner* — Ammar Hamid
(74) *Attorney, Agent, or Firm* — Armstrong Teasdale LLP

(57) ABSTRACT

A system includes a plurality of sources configured to provide a plurality of audio channels, and a control system including a processor, and a computer-readable storage media having computer-executable instructions embodied thereon. When executed by the processor, the computer-executable instructions cause the processor to adjust a master volume, identify a channel volume type associated with a first audio channel of the plurality of audio channels, and determine a channel volume associated with the first audio channel based at least partially on at least one of the adjustment of the master volume and the channel volume type.

20 Claims, 8 Drawing Sheets

(56) References Cited

U.S. PATENT DOCUMENTS

| | | |
|---|---|---|
| 2009/0190778 A1 | 7/2009 | Delia et al. |
| 2011/0235825 A1 | 9/2011 | Okabayashi |
| 2012/0051560 A1* | 3/2012 | Sanders .................. H03G 1/02 381/105 |
| 2012/0057725 A1 | 3/2012 | Nakamura |
| 2012/0110452 A1 | 5/2012 | Hiipakka et al. |

* cited by examiner

METHODS AND SYSTEMS FOR CONTROLLING VOLUME

CROSS REFERENCE TO RELATED APPLICATIONS

This application claims priority to U.S. Provisional Patent Application No. 61/819,468 filed May 3, 2013, which is hereby incorporated by reference in its entirety.

BACKGROUND

The present disclosure relates to audio systems and, more particularly, to methods and systems for controlling volume.

Some known audio systems include a volume dial that controls a volume of the audio system. At least some known audio systems include a master volume control that controls a volume associated with a plurality of sources. Controlling the volume associated with the sources may be difficult to manage for at least some known systems.

BRIEF SUMMARY

In one aspect, a computer-implemented method is provided for controlling a volume. The method includes adjusting a master volume, identifying a channel volume type associated with a first audio channel of the plurality of audio channels, and determining a channel volume associated with the first audio channel based at least partially on at least one of the adjustment of the master volume and the channel volume type.

In another aspect, one or more computer-readable storage media having computer-executable instructions embodied thereon is provided. When executed by a processor, the computer-executable instructions cause the processor to adjust a master volume, identify a channel volume type associated with a first audio channel of the plurality of audio channels, and determine a channel volume associated with the first audio channel based at least partially on at least one of the adjustment of the master volume and the channel volume type.

In yet another aspect, a system is provided. The system includes a plurality of sources configured to provide a plurality of audio channels, and a control system including a processor, and a computer-readable storage media having computer-executable instructions embodied thereon. When executed by the processor, the computer-executable instructions cause the processor to adjust a master volume, identify a channel volume type associated with a first audio channel of the plurality of audio channels, and determine a channel volume associated with the first audio channel based at least partially on at least one of the adjustment of the master volume and the channel volume type.

The features, functions, and advantages described herein may be achieved independently in various embodiments of the present disclosure or may be combined in yet other embodiments, further details of which may be seen with reference to the following description and drawings.

BRIEF DESCRIPTION OF THE DRAWINGS

FIG. 1 is a schematic illustration of an example environment for controlling volume in accordance with one aspect of the present disclosure.

FIGS. 2-7 are schematic illustrations of a plurality of channels and a channel volume associated with each channel in accordance with one aspect of the present disclosure.

FIG. 8 is a schematic illustration of an example computing device that may be used in the environment shown in FIG. 1 to control channel volume as shown in FIGS. 2-7 in accordance with one aspect of the present disclosure.

Although specific features of various implementations may be shown in some drawings and not in others, this is for convenience only. Any feature of any drawing may be referenced and/or claimed in combination with any feature of any other drawing.

DETAILED DESCRIPTION

The subject matter described herein relates generally to audio systems and, more particularly, to methods and systems for controlling volume. The following detailed description illustrates implementations of the subject matter described in this application by way of example and not by way of limitation. It is contemplated that the subject matter described herein has general application to manage and/or control volume in any environment designed to be executed by or on a computer including, without limitation, mobile phones, smart phones, tablets, personal digital assistants, laptops, desktops, automotive infotainment systems, and other appropriate computers in online and offline applications.

In one embodiment, a control system is programmed to determine a channel volume for each audio channel associated with the control system. Each audio channel is associated with a channel volume type, and the channel volume is adjusted and/or maintained based at least partially on a change and/or adjustment in a master volume, and a channel volume type associated with the audio channel. When the channel volume type is a relative volume type, the channel volume is adjusted substantially the same amount and/or substantially a similar proportion as the change and/or adjustment in the master volume. When the channel volume type is a fixed volume type, the channel volume is maintained. When the channel volume type is a follow main volume type, the channel volume is adjusted to be substantially equal to the master volume. Accordingly, the control system described herein enables a user to dynamically and systematically manage and/or control a channel volume associated with each audio channel of a plurality of audio channels using a common interface.

As used herein, an element or step recited in the singular and preceded with the word "a" or "an" should be understood as not excluding plural elements or steps, unless such exclusion is explicitly recited. Furthermore, references to one "implementation" or one "embodiment" of the subject matter described herein are not intended to be interpreted as excluding the existence of additional implementations that also incorporate the recited features. The following detailed description of implementations consistent with the principles of the disclosure refers to the accompanying drawings. In the absence of a contrary representation, the same reference numbers in different drawings may identify the same or similar elements.

Figure 1:
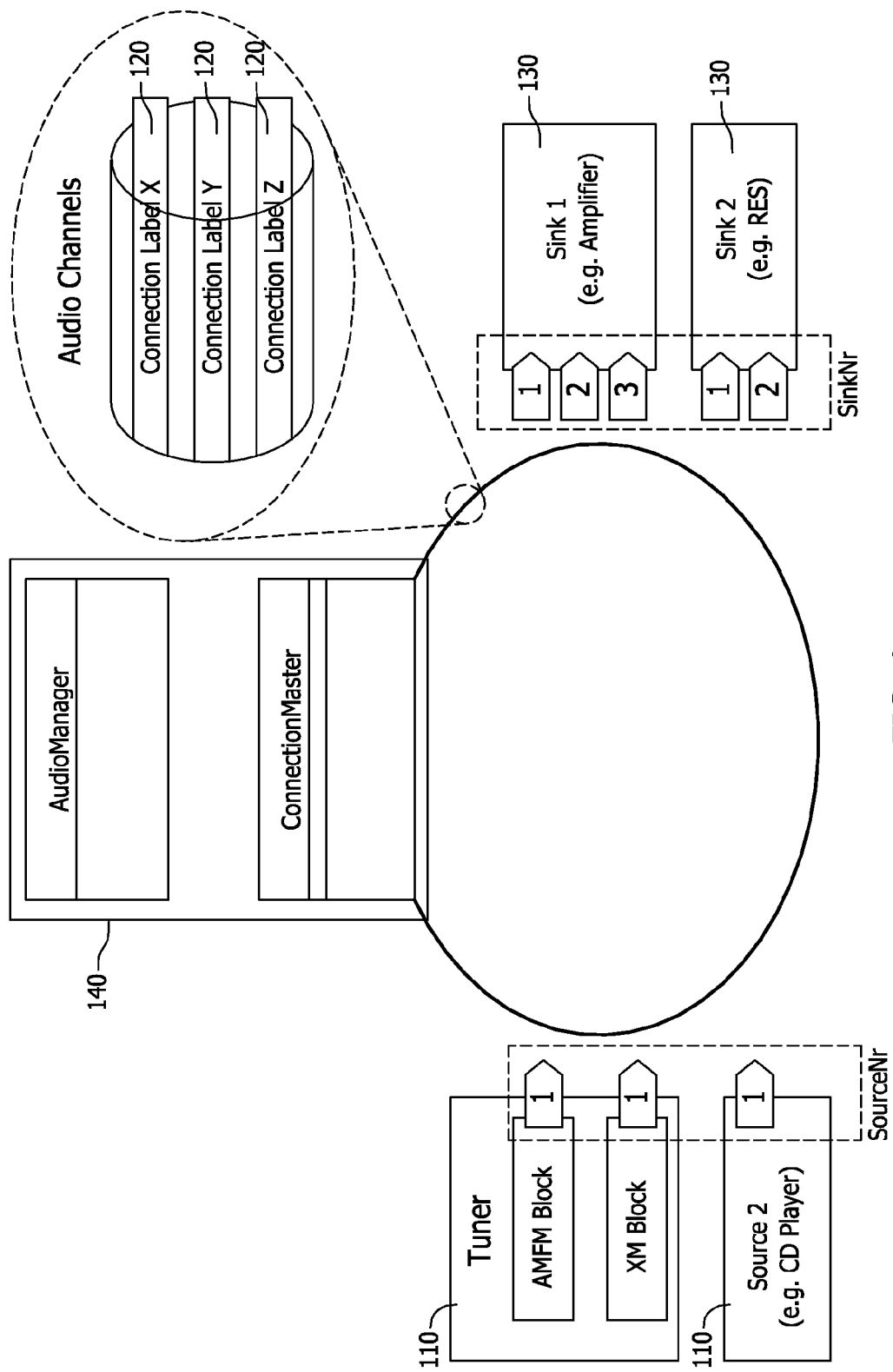
FIGS. 1-8 show example implementations of subject matter described herein.

FIG. 1 is a diagram of an example environment 100 for managing and/or controlling volume in accordance with one implementation of the subject matter described herein. In the exemplary embodiment, environment 100 includes a plurality of sources 110 that stream and/or provide audio channels 120. For example, in one implementation, sources 110 may include, without limitation, a tuner including an AM/FM block configured to provide an AM/FM audio channel, and an XM block configured to provide an XM audio channel, and/or a control box including an Audio block configured to provide an applications ("apps") audio channel, a USB/media player audio channel, a navigation guidance ("nav") audio channel, a hands-free technology ("HFT") audio channel, a user interface ("UI") audio channel, and/or a voice recognition ("voice rec") audio channel. Alternatively, any source may provide any channel that enables environment 100 to function as described herein.

In the exemplary embodiment, environment 100 includes a plurality of sinks or output devices 130 that receive audio channels 120, and output or present audio channels 120. For example, in one implementation, output devices 130 may include an amplifier including an amplifier block configured to present a main audio channel, a nav audio channel, an analog auxiliary ("analog aux") channel, a hands-free technology/telematics communication unit (HFT/TCU) channel, a UI channel, and/or a voice rec channel, and/or a rear entertainment system ("RES") including an RES block configured to present a left headphone channel and/or a right headphone channel. Alternatively, any output device may present any channel that enables environment 100 to function as described herein.

In the exemplary embodiment, environment 100 includes a control system 140 that manages or controls audio channels 120. In the exemplary implementation, control system 140 is configured to establish connections between at least one source 110 and at least one output device 130 to dynamically control streaming, transmission, and/or presentation of audio channels 120 based on user input and a predetermined algorithm and/or rule set. More specifically, in the exemplary embodiment, control system 140 is configured to stream, transmit, and/or present at least one audio channel 120 based at least partially on an availability of at least one source 110, an availability of at least one output device 130, a priority associated with at least one source 110, a priority associated with at least one output device 130, user input, and/or a predetermined event. Control system 140 is configured to allocate and/or deallocate each source 110, audio channel 120, and/or output device 130 based on user input. Alternatively, audio channel 120 may be transmitted using any mechanism and/or device that enable the environment 100 to function as described herein.

FIGS. 2-7 are schematic illustrations of a plurality of channels 210 and a channel volume 220 associated with each channel 210. In the exemplary embodiment, control system 140 is configured to adjust each channel volume 220 individually and/or adjust a master volume 230 to adjust at least one channel volume 220 based at least partially on a predetermined rule set. In the exemplary embodiment, each channel volume 220 is associated with a volume type 240 (shown, e.g., in FIG. 7) that identifies and/or determines a rule set for the associated channel 210. In the exemplary embodiment, volume types 240 include, without limitation, "relative", "fixed", and/or "follow main". Alternatively, control system 140 may include any number and/or type of volume types that enable the methods and systems to function as described herein.

In the exemplary embodiment, control system 140 identifies a channel volume type associated with at least one audio channel 210, and determines a channel volume 220 associated with the at least one audio channel 210 based at least partially on the adjustment of master volume 230 and/or volume type 240. For example, in one implementation, control system 140 calculates a master volume difference 250 between a first master volume 260 and a second master volume 270, and first channel volume 280 is identified for each channel 210, and a second channel volume 290 is determined based at least partially on master volume difference 250, first channel volume 280, and/or the rule set associated with the relative volume type.

Figure 2:
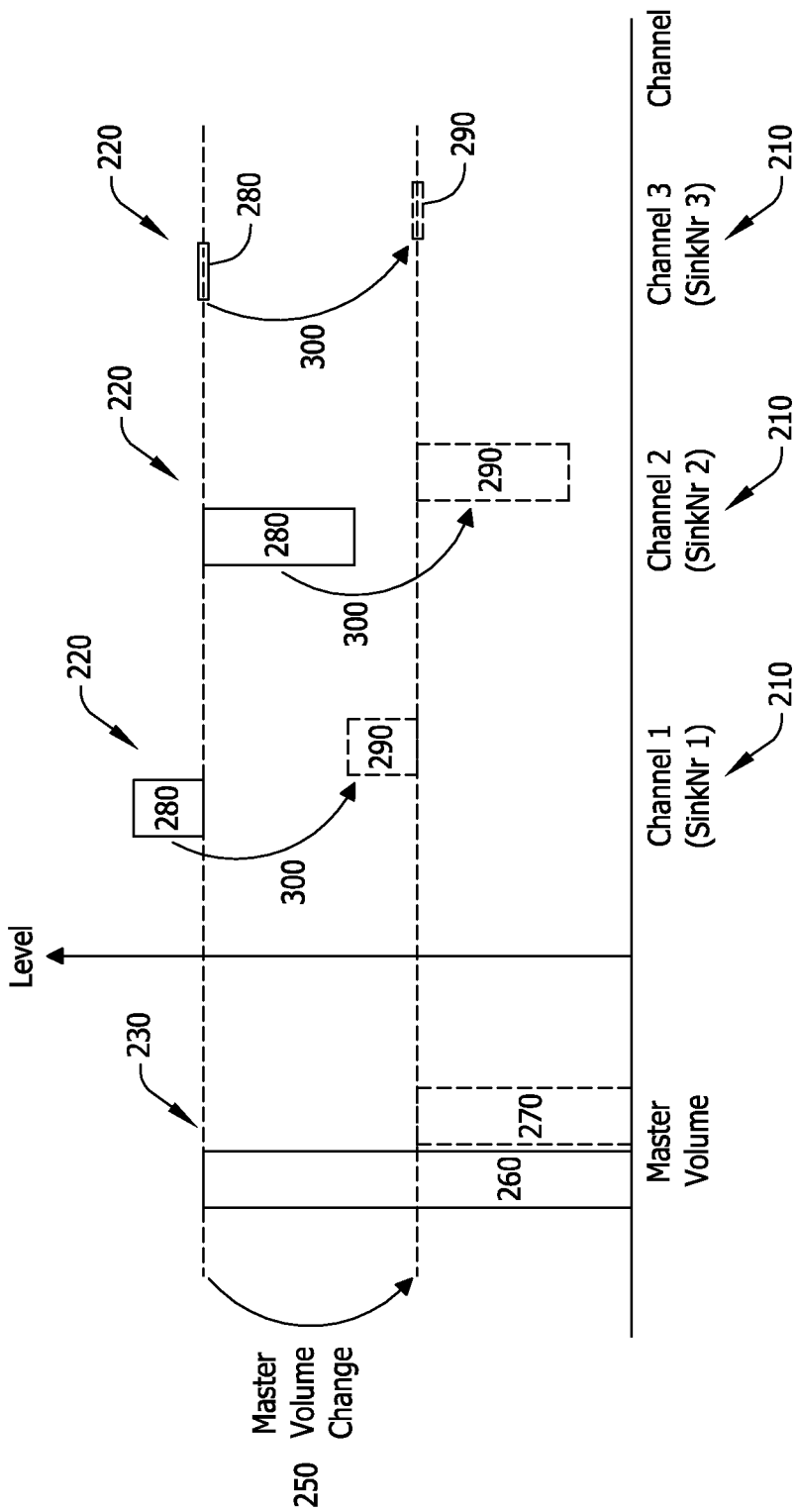

FIG. 2 is a schematic illustration of a plurality of channels 210 each having a relative volume type. In the exemplary embodiment, each channel volume 220 is adjusted with respect to master volume 230 by a predetermined amount (e.g., dB, percentage, or some other quantifiable measure of channel volume 22 and/or master volume 230). More specifically, in the exemplary embodiment, each channel volume 220 is adjusted such that a channel volume difference 300 between first channel volume 280 and second channel volume 290 is substantially equal to master volume difference 250. For example, as shown in FIG. 2, master volume 230 is adjusted from a first master volume 260 of approximately 20 to a second master volume 270 of approximately 10. In such an implementation, each channel volume 220 is decreased by approximately 10 (i.e., absolute change from approximately 20 and approximately 10) such that Channel 1 is adjusted from a first channel volume 280 of approximately 23 to a second channel volume 290 of approximately 13, Channel 2 is adjusted from a first channel volume 280 of approximately 14 to a second channel volume 290 of approximately 4, and Channel 3 is adjusted from a first channel volume 280 of approximately 20 to a second channel volume 290 of approximately 10.

As shown in FIG. 2, first channel volume 280 and second channel volume 290 are shown as volumes relative to first master volume 260 and second master volume 270, respectively. For example, channel volume 220 associated with Channel 1 is shown as being approximately 3 higher than master channel volume 230, channel volume 220 associated with Channel 2 is shown as being approximately 6 lower than master channel volume 230, and channel volume 220 associated with Channel 3 is shown as being approximately equal to master channel volume 230.

Alternatively, master volume difference 250 may be calculated to be a percentage or a proportion of master volume 230 such that channel volumes 220 are each adjusted proportionally. For example, in one implementation, master volume 230 is adjusted from a first master volume 260 of approximately 20 to a second master volume 270 of approximately 10. In such an implementation, each channel volume 220 is adjusted to be approximately 50% (i.e., relative change from approximately 20 to approximately 10) of a respective first channel volume 280 such that Channel 1 is adjusted from a first channel volume 280 of approximately 23 to a second channel volume 290 of approximately 11.5, Channel 2 is adjusted from a first channel volume 280 of approximately 14 to a second channel volume 290 of approximately 7, and Channel 3 is adjusted from a first channel volume 280 of approximately 20 to a second channel volume 290 of approximately 10.

Figure 3:
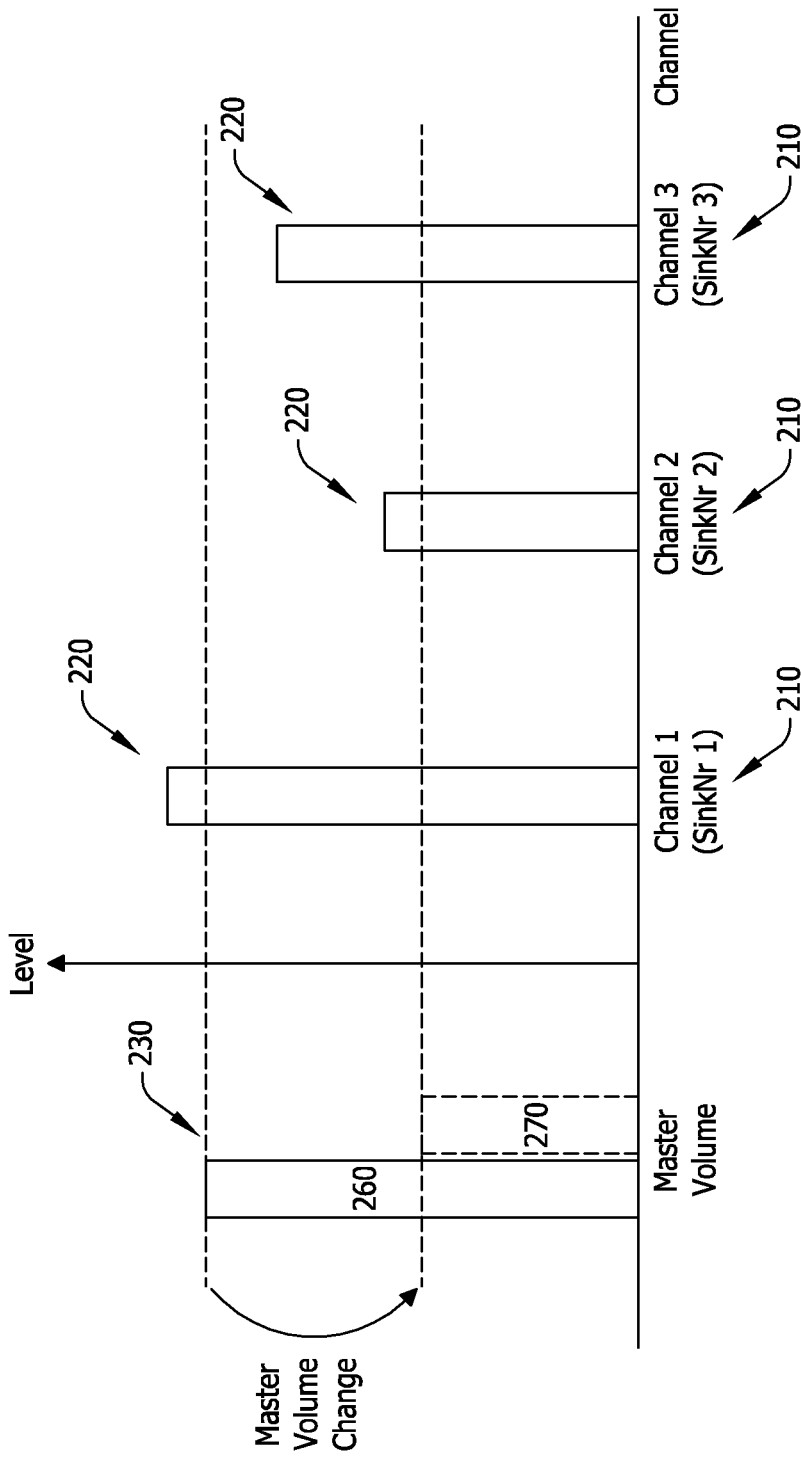

FIG. 3 is a schematic illustration of a plurality of channels 210 each having a fixed volume type. In the exemplary embodiment, each channel volume 220 is fixed. That is, each channel volume 220 is independent of the master volume. For example, as shown in FIG. 3, master volume 230 is adjusted from a first master volume 260 of approximately 20 to a second master volume 270 of approximately 10. In such an implementation, each channel volume 220 is maintained at a respective channel volume 220 such that Channel 1 is maintained at a channel volume 220 of approximately 23, Channel 2 is maintained at a channel volume 220 of approximately 14, and Channel 3 is maintained at a channel volume 220 of approximately 20.

Figure 4:
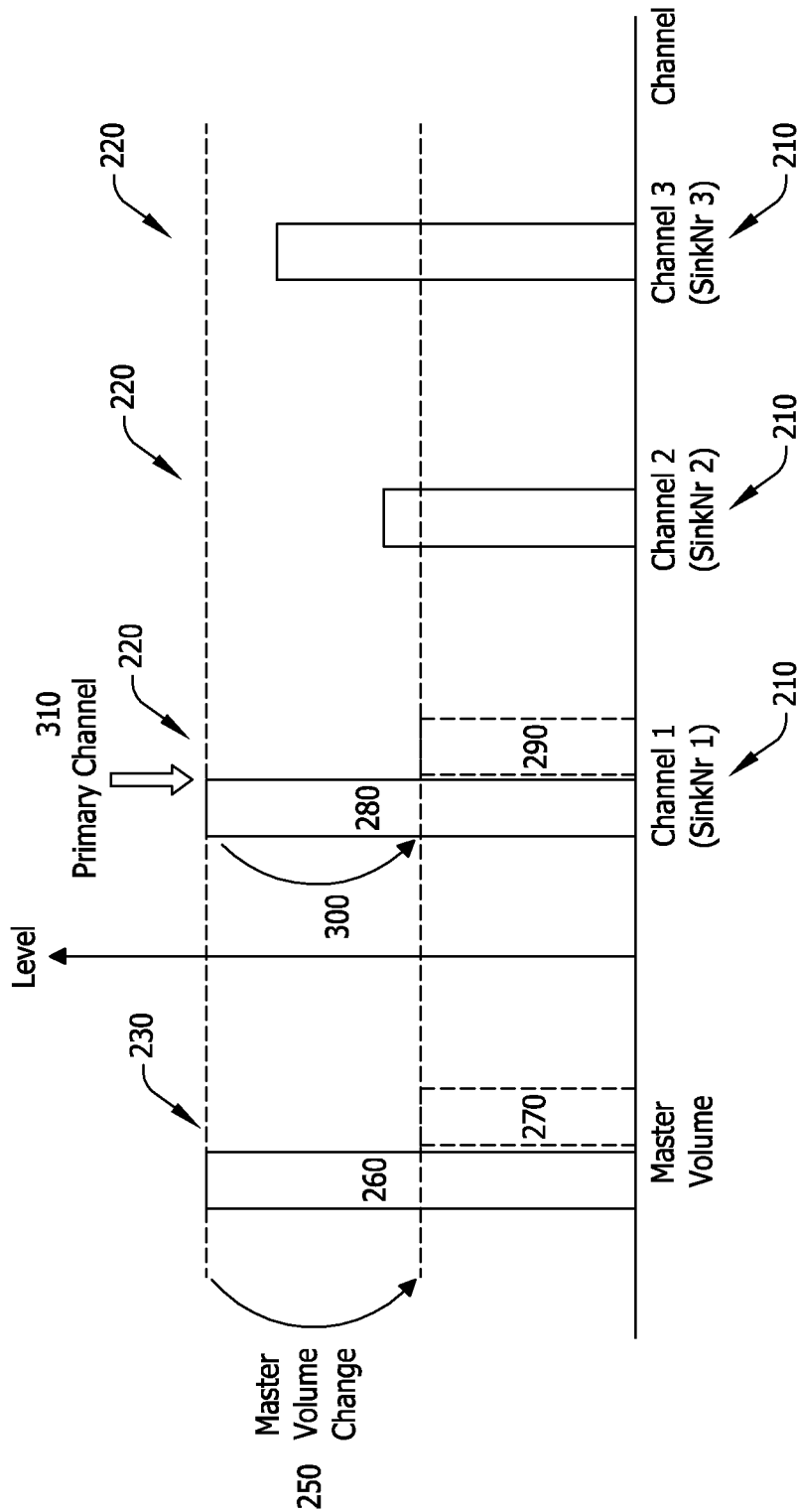
Figure 5:
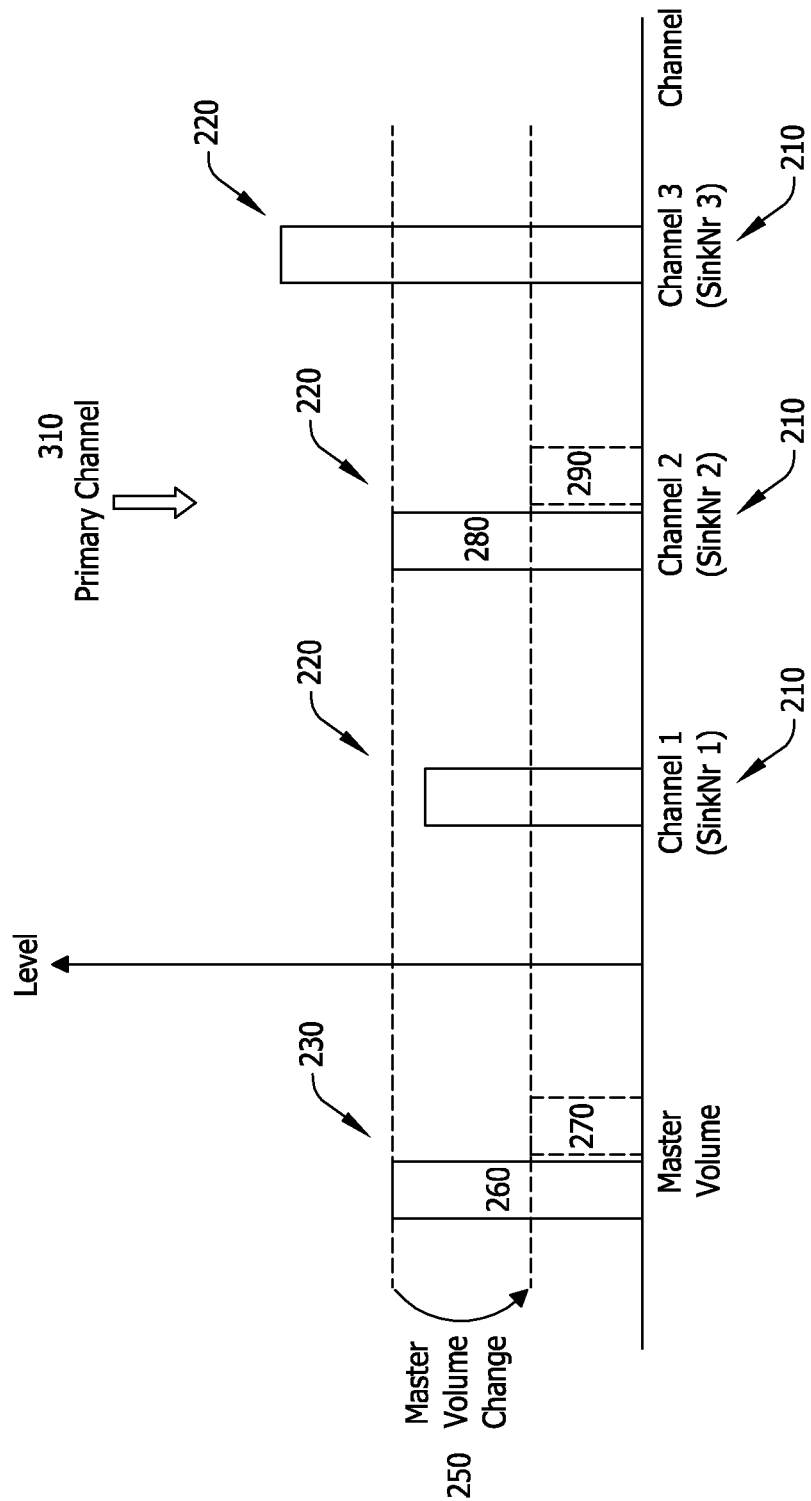
Figure 6:
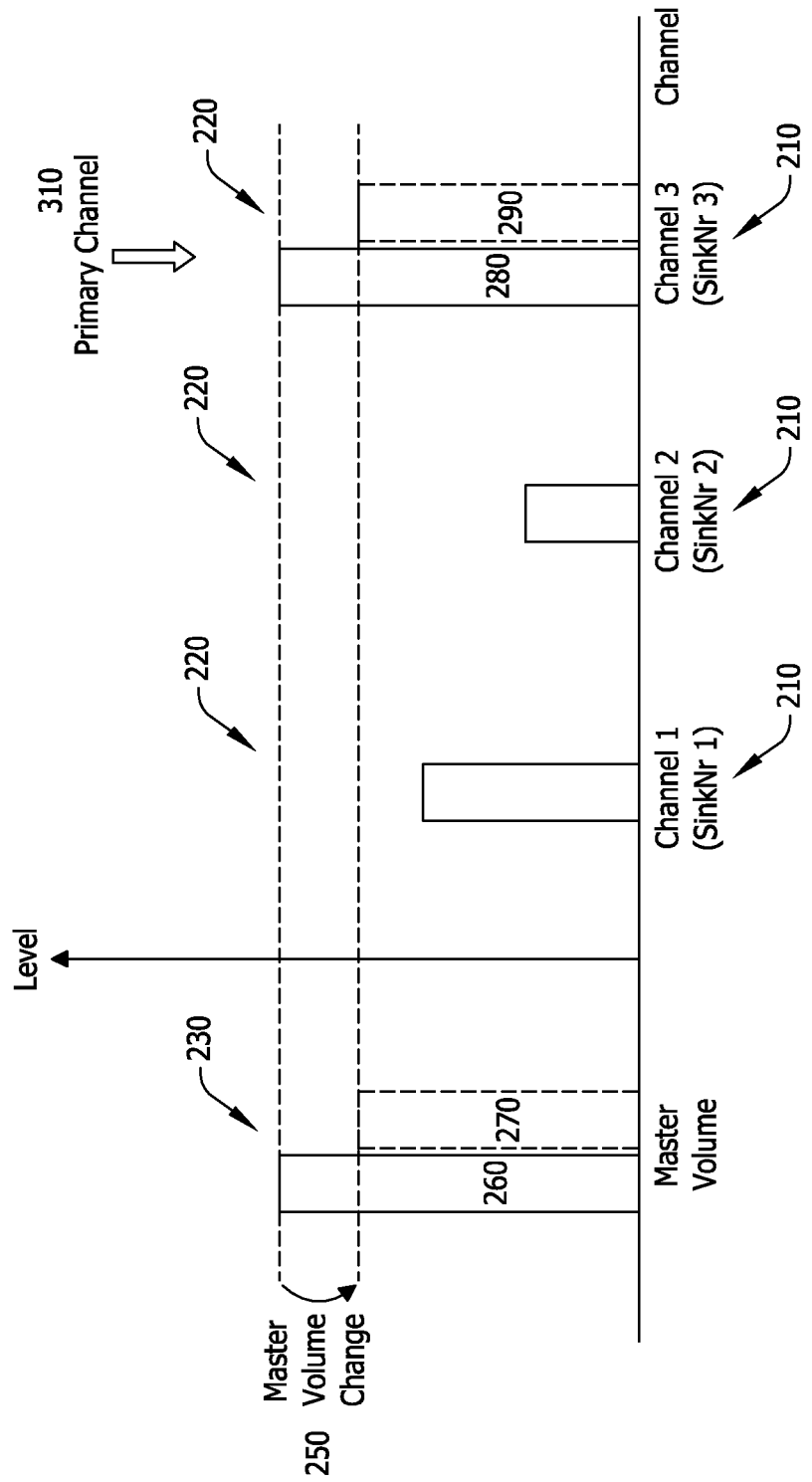

FIGS. 4-6 are schematic illustrations of a plurality of channels 210 each having a follow main volume type. In the exemplary embodiment, one channel is marked or identified with a primary tag to identify which channel is configured to follow master volume 230. The primary tag may dynamically change based on priorities and/or configuration of channels 120. In the exemplary embodiment, a channel volume 220 associated with a primary channel 310 "follows" master volume 230. That is, in the exemplary embodiment, channel volume 220 associated with primary channel 310 is adjusted such that a channel volume difference 300 between first channel volume 280 and second channel volume 290 is substantially equal to master volume difference 250. Moreover, in the exemplary embodiment, a channel volume 220 associated with a channel 210 not identified as primary channel 310 is fixed.

For example, as shown in FIG. 4, master volume 230 is adjusted from a first master volume 260 of approximately 20 to a second master volume 270 of approximately 10. In such an implementation, channel volume 220 associated with primary channel 310 (e.g., Channel 1) is adjusted to follow master volume 230 such that Channel 1 is adjusted from a first channel volume 280 of approximately 20 to a second channel volume 290 of approximately 10, and each channel volume 220 not associated with primary channel (e.g., Channels 2 and 3) is maintained at a respective channel volume 220 such that Channel 2 is maintained at a channel volume 220 of approximately 12, and Channel 3 is maintained at a channel volume 220 of approximately 17.

In the exemplary embodiment, when a channel 210 becomes a primary channel 310, master volume 230 is "overwritten" by channel volume 220 associated with the new primary channel 210. That is, in the exemplary embodiment, master volume 230 is adjusted to be substantially equal to channel volume 220 associated with the new primary channel 310. In the exemplary embodiment, channel volume 220 associated with the former primary channel 310 is maintained (i.e., the former primary channel 310 becomes associated with a fixed volume type) when master volume 230 is overwritten by channel volume 220 associated with the new primary channel 210.

For example, as shown in FIG. 5, Channel 2 is identified as the new primary channel 310 and, thus, master volume 230 is overwritten by channel volume 220 associated with Channel 2. More specifically, in such an implementation, master volume 230 is adjusted from approximately 10 (see FIG. 4) to a master volume 230 of approximately 12 (i.e., channel volume 220 associated with Channel 2). As shown in FIG. 5, master volume 230 is adjusted from a first master volume 260 of approximately 12 to a second master volume 270 of approximately 4. In such an implementation, channel volume 220 associated with primary channel 310 (e.g., Channel 2) is adjusted to follow master volume 230 such that Channel 2 is adjusted from a first channel volume 280 of approximately 12 to a second channel volume 290 of approximately 4, and each channel volume 220 not associated with primary channel (e.g., Channels 1 and 3) is maintained at a respective channel volume 220 such that Channel 1 is maintained at a channel volume 220 of approximately 10, and Channel 3 is maintained at a channel volume 220 of approximately 17.

As shown in FIG. 6, Channel 3 is identified as the new primary channel 310 and, thus, master volume 230 is overwritten by channel volume 220 associated with Channel 3. More specifically, in such an implementation, master volume 230 is adjusted from a master volume 230 of approximately 4 (see FIG. 5) to a master volume 230 of approximately 17 (i.e., channel volume 220 associated with Channel 3). As shown in FIG. 6, master volume 230 is adjusted from a first master volume 260 of approximately 17 to a second master volume 270 of approximately 13. In such an implementation, channel volume 220 associated with primary channel 310 (e.g., Channel 3) is adjusted to follow master volume 230 such that Channel 3 is adjusted from a first channel volume 280 of approximately 17 to a second channel volume 290 of approximately 13, and each channel volume 220 not associated with primary channel (e.g., Channels 1 and 2) is maintained at a respective channel volume 220 such that Channel 1 is maintained at a channel volume 220 of approximately 10, and Channel 2 is maintained at a channel volume 220 of approximately 4.

Figure 7:
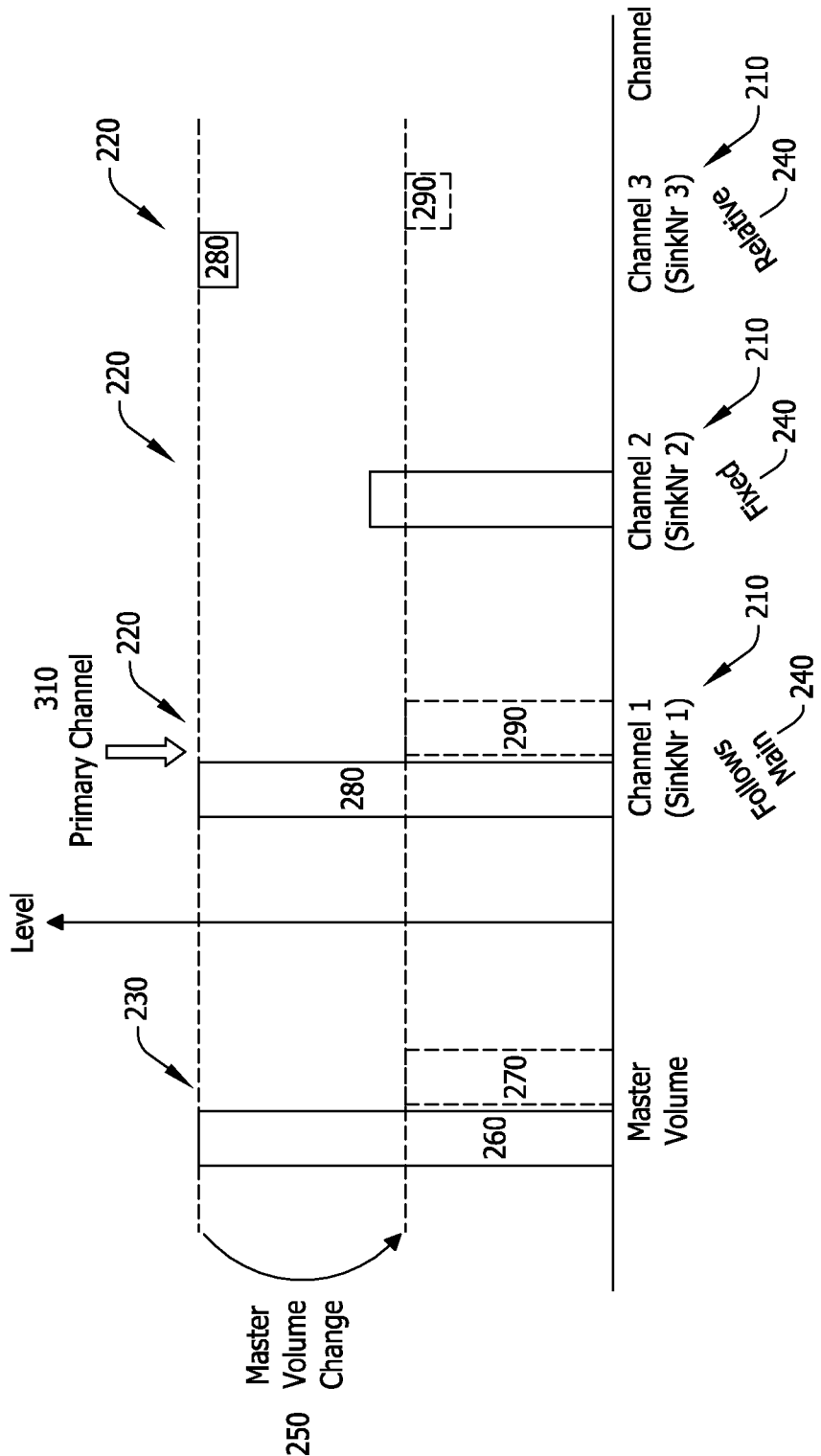

FIG. 7 is a schematic illustration of a plurality of channels 210 each having a respective volume type 240. In the exemplary embodiment, each channel 210 is selectively assigned and/or associated with a respective volume type 240. Control system 140 enables a user to selectively assign each channel 210 with a respective volume type 240 and/or independently adjust a volume associated with each channel 210. Moreover, control system 140 enables the user to desirably control and/or manage volumes for a plurality of channels 210 using a master volume control (e.g., a knob).

In one implementation, a main audio channel may be associated with a follow main volume type, a nav audio channel may be associated with a fixed volume type, an analog aux channel may be associated with a follow main volume type, an HFT/TCU channel may be associated with a follow main volume type, a UI channel may be associated with a fixed audio type, and/or a voice rec channel may be associated with a fixed audio type. In another implementation, a main audio channel may be associated with a relative volume type, a nav audio channel may be associated with a relative type, an analog aux channel may be associated with a relative volume type, an HFT/TCU channel may be associated with a relative volume type, a UI channel may be associated with a fixed audio type, and/or a voice rec channel may be associated with a relative audio type. Alternatively, any channel 210 may be associated with any volume type 240 that enables the methods and systems to function as described herein.

For example, as shown in FIG. 7, Channel 1 is associated with a follow main volume type, Channel 2 is associated with a fixed volume type, and Channel 3 is associated with a relative volume type. In such an implementation, master volume 230 is adjusted from a first master volume 260 of approximate 20 to a second master volume 270 of approximately 10. In such an implementation, channel volume 220 associated with Channel 1 is adjusted to follow master volume 230 from a first channel volume 280 of approximately 20 to a second channel volume 290 of approximately 10, channel volume 220 associated with Channel 2 is maintained at a channel volume 220 of approximately 13, and channel volume 220 associated with Channel 3 is decreased by approximately 10 (i.e., absolute change from approximately 20 and approximately 10) from a first channel volume 280 of approximately 18 to a second channel volume 290 of approximately 8.

Figure 8:
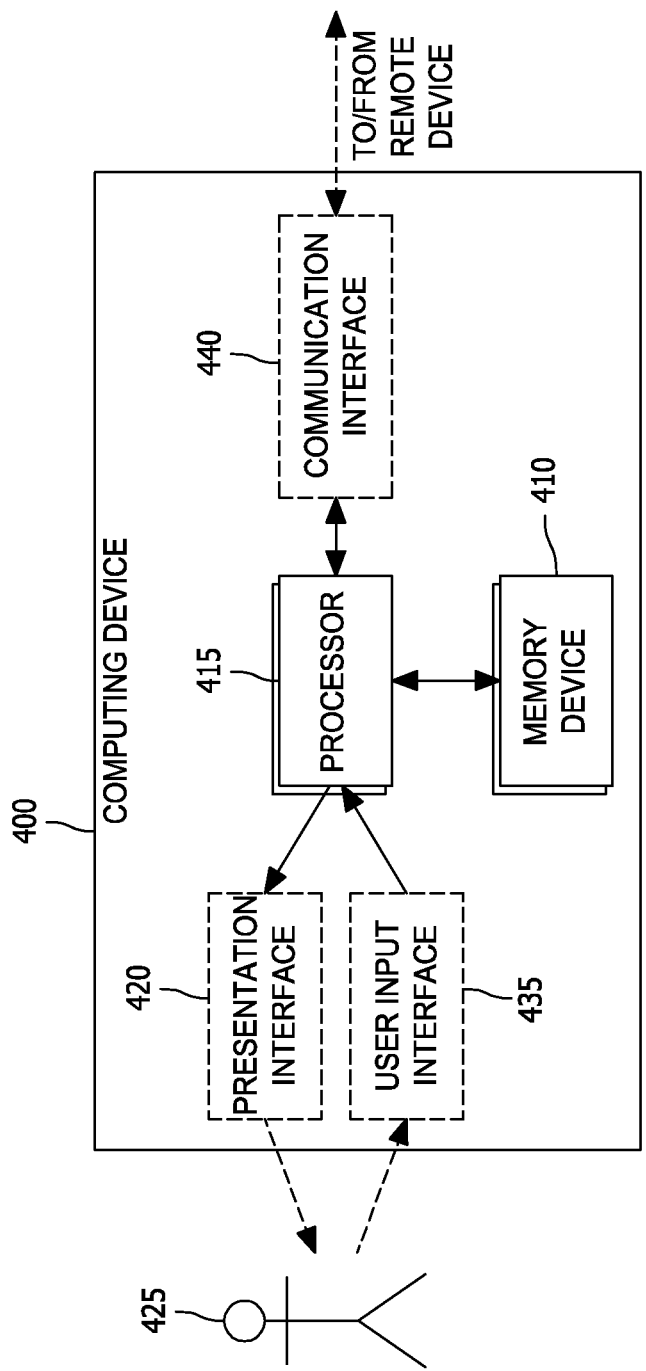

FIG. 8 is a schematic illustration of an example computing device 400 (e.g., control system 140) that may be used in environment 100 to manage or control audio channels 120. Computing device 400 may include sources 110 and output devices 130 in a common unit (e.g., personal computer), or computing device 400, sources 110, and output devices 130 may be distributed across a system interconnected by at least one communication bus (e.g., an Automotive Infotainment System).

Computing device 400 includes at least one memory device 410 and a processor 415 that is coupled to memory device 410 for executing instructions. In some implementations, executable instructions are stored in memory device 410. In the exemplary embodiment, computing device 400 performs one or more operations described herein by programming processor 415. For example, processor 415 may be programmed by encoding an operation as one or more executable instructions and by providing the executable instructions in memory device 410.

Processor 415 may include one or more processing units (e.g., in a multi-core configuration). Further, processor 415 may be implemented using one or more heterogeneous processor systems in which a main processor is present with secondary processors on a single chip. In another illustrative example, processor 415 may be a symmetric multi-processor system containing multiple processors of the same type. Further, processor 415 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein.

In the exemplary embodiment, memory device 410 is one or more devices that enable information such as executable instructions and/or other data to be stored and retrieved. Memory device 410 may include one or more computer readable media, such as, without limitation, dynamic random access memory (DRAM), static random access memory (SRAM), a solid state disk, and/or a hard disk. Memory device 410 may be configured to store, without limitation, application source code, application object code, source code portions of interest, object code portions of interest, configuration data, execution events and/or any other type of data.

In the exemplary embodiment, computing device 400 includes a presentation interface 420 that is coupled to processor 415. Presentation interface 420 presents information to a user 425. For example, presentation interface 420 may include a display adapter (not shown) that may be coupled to a display device, such as a cathode ray tube (CRT), a liquid crystal display (LCD), an organic LED (OLED) display, and/or an "electronic ink" display. In some implementations, presentation interface 420 includes one or more display devices.

In the exemplary embodiment, computing device 400 includes a user input interface 435. User input interface 435 is coupled to processor 415 and receives input from user 425. User input interface 435 may include, for example, a keyboard, a pointing device, a mouse, a stylus, a touch sensitive panel (e.g., a touch pad or a touch screen), a gyroscope, an accelerometer, a position detector, and/or an audio user input interface. A single component, such as a touch screen, may function as both a display device of presentation interface 420 and user input interface 435.

Computing device 400, in the exemplary embodiment, includes a communication interface 440 coupled to processor 415. Communication interface 440 communicates with one or more remote devices. To communicate with remote devices, communication interface 440 may include, for example, a wired network adapter, a wireless network adapter, and/or a mobile telecommunications adapter.

The methods and systems described herein may be implemented using computer programming or engineering techniques including computer software, firmware, hardware or any combination or subset thereof, wherein the technical effects may be achieved by performing at least one of the following steps: a) adjusting a master volume; b) identifying a channel volume type associated with a first audio channel of the plurality of audio channels; c) and determining a channel volume associated with the first audio channel based at least partially on at least one of the adjustment of the master volume and the channel volume type.

The present disclosure relates generally to audio systems and, more particularly, to methods and systems for controlling volume. The methods and systems described herein enable each channel or, more specifically, a channel volume associated with each channel to be selectively controlled. A master volume control controls a volume associated with a plurality of channels and a channel volume control controls a volume associated with an associated channel. Each channel is selectively associated with a control type: (1) a relative volume type that adjusts a channel volume when the master volume is adjusted such that a difference between the channel volume and the master volume is maintained, (2) a fixed volume configuration that maintains the channel volume even when the master volume is adjusted, or (3) a follow main configuration that adjusts the channel volume to be the same as the master volume when the master volume is adjusted. Accordingly, the methods and systems described herein enable an audio system to be customized according to user preferences.

Exemplary embodiments of a customizable audio system are described above in detail. The methods and systems are not limited to the specific embodiments described herein, but rather, components of systems and/or steps of the method may be utilized independently and separately from other components and/or steps described herein. Each method step and each component may also be used in combination with other method steps and/or components. Although specific features of various embodiments may be shown in some drawings and not in others, this is for convenience only. Any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for controlling a volume, the method implemented using a computing device coupled to a memory device, the method comprising:

receiving, at the computing device, a first audio input of a plurality of audio inputs, wherein each audio input of the plurality of audio inputs is associated with an audio source, and wherein each audio input is associated with an audio input volume and an audio input volume type, wherein the audio input volume type refers to a type of relationship between a master volume and the audio input volume;

adjusting the master volume;

determining, at the computing device, the audio input volume for the first audio input;

identifying, at the computing device, the audio input volume type associated with the first audio input; and determining, at the computing device, an updated audio input volume associated with the first audio input based at least partially on the adjustment of the master volume, the audio input volume type, and the audio input volume associated with the first audio input.

2. A method in accordance with claim 1, wherein identifying the audio input volume type comprises identifying the audio input volume type to be a relative volume type, and determining the updated audio input volume comprises:
   determining a master volume difference between a first master volume before the adjustment of the master volume and a second master volume after the adjustment of the master volume;
   identifying a first audio input volume associated with the first audio input; and
   determining a second audio input volume associated with the first audio input such that a difference between the first audio input volume and the second audio input volume is substantially equal to the master volume difference.

3. A method in accordance with claim 1, wherein identifying the audio input volume type comprises identifying the audio input volume type to be a relative volume type, and determining an updated audio input volume comprises:
   determining a master volume proportional relationship between a first master volume before the adjustment of the master volume and a second master volume after the adjustment of the master volume;
   identifying a first audio input volume associated with the first audio input; and
   determining a second audio input volume associated with the first audio input such that a proportional relationship between the first audio input volume and the second audio input volume is substantially equal to the master volume proportional relationship.

4. A method in accordance with claim 1, wherein identifying the audio input volume type comprises identifying the audio input volume type to be a fixed volume type, and determining an updated audio input volume comprises maintaining the audio input volume associated with the first audio input.

5. A method in accordance with claim 1, wherein identifying the audio input volume type comprises identifying the audio input volume type to be a follow main volume type, and determining an updated audio input volume comprises:
   identifying a master volume after the adjustment of the master volume; and
   determining a-the audio input volume associated with the first audio input that is substantially equal to the master volume.

6. A method in accordance with claim 1, wherein identifying the audio input volume type comprises identifying the audio input volume type to be a follow main volume type, and determining an updated audio input volume comprises:
   identifying a master volume after the adjustment of the master volume;
   determining whether the first audio input is associated with a tag; and
   if the first audio input is associated with the tag, determining an updated audio input volume associated with the first audio input that is substantially equal to the master volume.

7. A method in accordance with claim 1, wherein identifying the audio input volume type comprises identifying the audio input volume type to be a follow main volume type, and determining an updated audio input volume comprises:
   identifying a master volume after the adjustment of the master volume;
   determining whether the first audio input is associated with a tag; and
   if the first audio input is not associated with the tag, maintaining the audio input volume associated with the first audio input.

8. One or more non-transitory computer-readable storage media having computer-executable instructions embodied thereon, wherein, when executed by at least one processor, the computer-executable instructions cause the processor to:
   receive a first audio input of a plurality of audio inputs, wherein each audio input of the plurality of audio inputs is associated with an audio source, and wherein each audio input is associated with an audio input volume and an audio input volume type, wherein the audio input volume type refers to a type of relationship between a master volume and the audio input volume;
   adjust the master volume;
   determine the audio input volume for the first audio input;
   identify the audio input volume type associated with a first audio input; and
   determine an updated audio input volume associated with the first audio input based at least partially on the adjustment of the master volume, the audio input volume type, and the audio input volume associated with the first audio input.

9. One or more non-transitory computer-readable storage media in accordance with claim 8, wherein the audio input volume type is identified to be a relative volume type, and the computer-executable instructions cause the processor to:
   determine a master volume difference between a first master volume before the adjustment of the master volume and a second master volume after the adjustment of the master volume;
   identify a first audio input volume associated with the first audio input; and
   determine a second audio input volume associated with the first audio input such that a difference between the first audio input volume and the second audio input volume is substantially equal to the master volume difference.

10. One or more non-transitory computer-readable storage media in accordance with claim 8, wherein the audio input volume type is identified to be a relative volume type, and the computer-executable instructions cause the processor to:
   determine a master volume proportional relationship between a first master volume before the adjustment of the master volume and a second master volume after the adjustment of the master volume;
   identify a first audio input volume associated with the first audio input; and
   determine a second audio input volume associated with the first audio input such that a proportional relationship between the first audio input volume and the second audio input volume is substantially equal to the master volume proportional relationship.

11. One or more non-transitory computer-readable storage media in accordance with claim 8, wherein the audio input volume type is identified to be a fixed volume type, and the computer-executable instructions cause the processor to maintain an audio input volume associated with the first audio input.

12. One or more non-transitory computer-readable storage media in accordance with claim 8, wherein the audio input volume type is identified to be a follow main volume type, and the computer-executable instructions cause the processor to:
   identify a master volume after the adjustment of the master volume; and determine an audio input volume associated with the first audio input that is substantially equal to the master volume.

13. One or more non-transitory computer-readable storage media in accordance with claim 8, wherein the audio input volume type is identified to be a follow main volume type, and the computer-executable instructions cause the processor to:
identify a master volume after the adjustment of the master volume;
determine whether the first audio input is associated with a tag; and
if the first audio input is associated with the tag, determine an audio input volume associated with the first audio input that is substantially equal to the master volume.

14. One or more non-transitory computer-readable storage media in accordance with claim 8, wherein the audio input volume type is identified to be a follow main volume type, and the computer-executable instructions cause the processor to:
identify a master volume after the adjustment of the master volume;
determine whether the first audio input is associated with a tag; and
if the first audio input is not associated with the tag, maintain the audio input volume associated with the first audio input.

15. A system comprising:
a plurality of sources configured to provide a plurality of audio inputs; and
a control system comprising a processor, and a computer-readable storage device having encoded thereon computer-readable instructions that are executable by the processor to perform functions comprising:
receive a first audio input of a plurality of audio inputs, wherein each audio input of the plurality of audio inputs is associated with an audio input volume and an audio input volume type, wherein the audio input volume type refers to a type of relationship between a master volume and the audio input volume;
adjust the master volume;
determine the audio input volume for the first audio input;
identify audio input volume type associated with a first audio input of the plurality of audio inputs; and
determine an updated volume associated with the first audio input based at least partially on the adjustment of the master volume, the audio volume type, and the audio input volume associated with the first audio input.

16. A system in accordance with claim 15, wherein the audio input volume type is identified to be a relative volume type, and the computer-executable instructions cause the processor to:
determine a master volume difference between a first master volume before the adjustment of the master volume and a second master volume after the adjustment of the master volume;
identify a first audio input volume associated with the first audio input; and
determine a second audio input volume associated with the first audio input such that a difference between the first audio input volume and the second audio input volume is substantially equal to the master volume difference.

17. A system in accordance with claim 15, wherein the audio input volume type is identified to be a relative volume type, and the computer-executable instructions cause the processor to:
determine a master volume proportional relationship between a first master volume before the adjustment of the master volume and a second master volume after the adjustment of the master volume;
identify a first audio input volume associated with the first audio input; and
determine a second audio input volume associated with the first audio input such that a proportional relationship between the first audio input volume and the second audio input volume is substantially equal to the master volume proportional relationship.

18. A system in accordance with claim 15, wherein the audio input volume type is identified to be a fixed volume type, and the computer-executable instructions cause the processor to maintain an audio input volume associated with the first audio input.

19. A system in accordance with claim 15, wherein the audio input volume type is identified to be a follow main volume type, and the computer-executable instructions cause the processor to:
identify a master volume after the adjustment of the master volume; and
determine audio input volume associated with the first audio input that is substantially equal to the master volume.

20. A system in accordance with claim 15, wherein the audio input volume type is identified to be a follow main volume type, and the computer-executable instructions cause the processor to:
identify a master volume after the adjustment of the master volume;
determine whether the first audio input is associated with a tag;
if the first audio input is associated with the tag, determine an audio input volume associated with the first audio input that is substantially equal to the master volume; and
if the first audio input is not associated with the tag, maintain the audio input volume associated with the first audio input.

* * * * *